United States Patent
Hashimoto et al.

(10) Patent No.: US 8,921,231 B2
(45) Date of Patent: Dec. 30, 2014

(54) GROUP III NITRIDE WAFER AND ITS PRODUCTION METHOD

(71) Applicants: SixPoint Materials, Inc., Buellton, CA (US); Seoul Semiconductor Co., Ltd., Seoul (KR)

(72) Inventors: Tadao Hashimoto, Santa Barbara, CA (US); Edward Letts, Buellton, CA (US); Sierra Hoff, Solvang, CA (US)

(73) Assignees: SixPoint Materials, Inc., Buellton, CA (US); Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 13/835,636

(22) Filed: Mar. 15, 2013

(65) Prior Publication Data

US 2014/0065796 A1     Mar. 6, 2014

Related U.S. Application Data

(60) Provisional application No. 61/694,119, filed on Aug. 28, 2012.

(51) Int. Cl.
| | |
|---|---|
| H01L 21/461 | (2006.01) |
| H01L 29/201 | (2006.01) |
| H01L 29/20 | (2006.01) |
| C30B 7/10 | (2006.01) |
| C30B 29/40 | (2006.01) |
| C30B 33/10 | (2006.01) |
| H01L 21/02 | (2006.01) |
| C30B 33/00 | (2006.01) |

(52) U.S. Cl.
CPC .......... *H01L 29/201* (2013.01); *H01L 29/2003* (2013.01); *C30B 7/105* (2013.01); *C30B 29/403* (2013.01); *C30B 33/10* (2013.01); *H01L 21/02013* (2013.01); *H01L 21/02019* (2013.01); *C30B 29/406* (2013.01); *C30B 33/00* (2013.01)
USPC .......................................... 438/693; 438/690

(58) Field of Classification Search
USPC ........................................ 438/690, 691, 693
See application file for complete search history.

(56) References Cited

U.S. PATENT DOCUMENTS

| | | |
|---|---|---|
| 2002/0185054 A1 | 12/2002 | Xu et al. |
| 2005/0103257 A1 | 5/2005 | Xu et al. |

(Continued)

FOREIGN PATENT DOCUMENTS

| | | |
|---|---|---|
| EP | 2 031 103 A1 | 3/2009 |
| JP | 2012 031028 A | 2/2012 |

(Continued)

OTHER PUBLICATIONS

PCTUS2013/032006 International Search Report and Written Opinion date of mailing Jun. 25, 2013 (14 pages).

(Continued)

*Primary Examiner* — Bradley K Smith
(74) *Attorney, Agent, or Firm* — K&L Gates LLP

(57) ABSTRACT

The present invention discloses a group III nitride wafer such as GaN, AlN, InN and their alloys having one surface visually distinguishable from the other surface. After slicing of the wafer from a bulk crystal of group III nitride with a mechanical method such as multiple wire saw, the wafer is chemically etched so that one surface of the wafer is visually distinguishable from the other surface. The present invention also discloses a method of producing such wafers.

20 Claims, 3 Drawing Sheets

1          2

(56) References Cited

U.S. PATENT DOCUMENTS

| | | |
|---|---|---|
| 2007/0178807 A1* | 8/2007 | Gupta et al. ............. 451/5 |
| 2009/0236694 A1 | 9/2009 | Mizuhara et al. |
| 2010/0200955 A1 | 8/2010 | Oshima |
| 2010/0270649 A1 | 10/2010 | Ishibashi et al. |
| 2012/0000415 A1* | 1/2012 | D'Evelyn et al. ............. 117/94 |
| 2014/0061662 A1 | 3/2014 | Hashimoto et al. |
| 2014/0084297 A1 | 3/2014 | Hashimoto et al. |
| 2014/0087113 A1 | 3/2014 | Hashimoto et al. |
| 2014/0087209 A1 | 3/2014 | Hashimoto et al. |
| 2014/0124826 A1* | 5/2014 | Ishibashi et al. ............. 257/99 |

FOREIGN PATENT DOCUMENTS

| | | |
|---|---|---|
| WO | WO 2004/053206 A1 | 6/2004 |
| WO | WO 2008/042020 A2 | 4/2008 |
| WO | WO 2009/149300 A1 | 12/2009 |
| WO | WO 2010/017232 A1 | 2/2010 |
| WO | WO 2010/025153 A1 | 3/2010 |
| WO | WO 2010/088046 A1 | 8/2010 |
| WO | WO 2014/035481 A1 | 3/2014 |
| WO | WO 2014/051684 A1 | 4/2014 |
| WO | WO 2014/051692 A1 | 4/2014 |

OTHER PUBLICATIONS

Wang, B. et al., Inversion Domains and Parallel Growth in Ammonothermally Grown GaN Crystals; Journal of Crystal Growth, Elsevier, Amsterdam, NL. vol. 312, No. 18, Sep. 1, 2010, pp. 2507-2513, XP027184338, ISSN: 0022-0248 [retrieved on Apr. 9, 2010] p. 2509, col. 1, line 16-line 19.

PCTUS2013/032103 International Search Report and Written Opinion date of mailing Jun. 25, 2013 (17 pages).

U.S. Appl. No. 13/834,871, Office Action dated Jul. 3, 2014.

U.S. Appl. No. 13/834,871, Response dated Oct. 2, 2014.

* cited by examiner

GROUP III NITRIDE WAFER AND ITS PRODUCTION METHOD

CROSS REFERENCE TO RELATED APPLICATIONS

This application claims priority to U.S. App. No. 61/694,119 filed Aug. 28, 2012, by inventors Tadao Hashimoto, Edward Letts, and Sierra Hoff, entitled "GROUP III NITRIDE WAFER AND ITS PRODUCTION METHOD", which is incorporated by reference in its entirety as if put forth in full below.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," attorneys docket number 30794.179-US-U1 (2006-204), which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,";

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

which applications are incorporated by reference herein in their entirety as if put forth in full below.

BACKGROUND

1. Field of the Invention

The invention is related to a semiconductor wafer used for various device fabrication including optoelectronic and electronic devices such as light emitting diodes, (LEDs), laser diodes (LDs), photo detectors, and transistors. More specifically, the invention is on a compound semiconductor wafer composed of group III nitride.

2. Description of the Existing Technology (Note: This patent application refers several publications and patents as indicated with numbers within brackets, e.g., [x]. A list of these publications and patents can be found in the section entitled "References.")

Gallium nitride (GaN) and its related group III nitride alloys are the key material for various optoelectronic and electronic devices such as LEDs, LDs, microwave power transistors and solar-blind photo detectors. However, the majority of these devices are grown epitaxially on heterogeneous substrates (or wafers), such as sapphire and silicon carbide since GaN wafers are extremely expensive compared to these heteroepitaxial substrates. The heteroepitaxial growth of group III nitride causes highly defected or even cracked films, which hinder the realization of high-end electronic devices, such high-power microwave transistors.

To solve all fundamental problems caused by heteroepitaxy, it is indispensable to utilize group III nitride wafers sliced from group III nitride bulk crystals. For the majority of devices, GaN wafers are favorable because it is relatively easy to control the conductivity of the wafer and GaN wafer will provide the smallest lattice/thermal mismatch with most of device layers. However, due to the high melting point and high nitrogen vapor pressure at elevated temperature, it has been difficult to grow bulk GaN crystals. Currently, majority of commercially available GaN wafers are produced by a method called hydride vapor phase epitaxy (HVPE). HVPE is a vapor phase epitaxial film growth, thus difficult to produce bulk-shaped group III nitride crystals. Due to limitation of the crystal thickness, the typical density of line defects (e.g. dislocations) and grain boundaries is at the order of high $10^5$ to low $-10^6$ cm$^{-2}$.

To obtain high-quality GaN wafers of which density of dislocations and/or grain boundaries is less than $10^6$ cm$^{-2}$, a new method called ammonothermal growth has been developed [1-6]. Also, there are other bulk growth methods such as high-pressure solution growth or a flux method [7-10]. High-quality GaN wafers having density of dislocations and/or grain boundaries less than $10^6$ cm$^{-2}$ can be obtained by ammonothermal growth or other bulk growth methods. However, the utilization of a bulk growth method for wafer fabrication created a new problem which was not experienced when wafers were fabricated one by one with HVPE. In HVPE, thick film of group III nitride is epitaxially grown on a substrate such as sapphire or gallium arsenide. Then, the substrate is mechanically or chemically removed. In this way, one side of the group III nitride wafer is obviously distinguishable from the other side of the wafer because the top surface of an epitaxially grown film typically shows a crystallographic feature such as hillocks. On the contrary, wafer fabrication from bulk growth method typically involves slicing of wafers from grown bulk crystals. The bulk crystal is typically sliced into wafers with a multiple wire saw. Since the multiple wire saw is a mechanical means of cutting, the both surface of the sliced wafer become undistinguishable even though the wafer has a polarity. Since distinguishing one surface from the other is vital for the following process of wafer fabrication, it is important to make a wafer having distinguishable surfaces.

SUMMARY OF THE INVENTION

The present invention discloses a group III nitride wafer having one surface visually distinguishable from the other surface. After slicing of the wafer from a bulk crystal of group III nitride with a mechanical method such as a multiple wire saw, the wafer is etched, preferably chemically etched, so that one surface of the wafer is visually distinguishable from the other surface. The present invention also discloses a method of producing such wafers.

BRIEF DESCRIPTION OF THE DRAWINGS

Referring now to the drawings in which like reference numbers represent corresponding parts throughout.

In the figure each number represents the followings:
The first layer
1a. The surface of the first layer
The second layer
2a. The surface of the second layer
3. The third layer

DETAILED DESCRIPTION OF THE INVENTION

Overview

The group III nitride wafer of the present invention provides a wafer having one surface visually distinguishable from the other surface. The group III nitride wafer is suitable for fabricating various optoelectronic and electronic devices. Unlike the wafer fabrication method using vapor phase epitaxy, bulk crystals of group III nitride such as GaN, AlN, InN or alloy of such group III nitride are grown with a bulk growth method such as ammonothermal growth. Then, group III nitride wafers are sliced from a bulk crystal with a mechanical means such as a multiple wire saw. After the slicing, the both surfaces of the wafer looks almost identical because the surfaces become rough from the mechanical process. To identify one surface from the other surface, the wafers are chemically etched. After an appropriate chemical etching, one surface of the wafer can be visually distinguished from the other surface.

To fabricate a group III nitride wafer suitable for successive device fabrication, one surface of the wafer is polished. The present invention makes it possible to visually identify the surface which should be polished so that a mistake to process a wrong surface can be avoided.

Technical Description of the Invention

Figure 1:
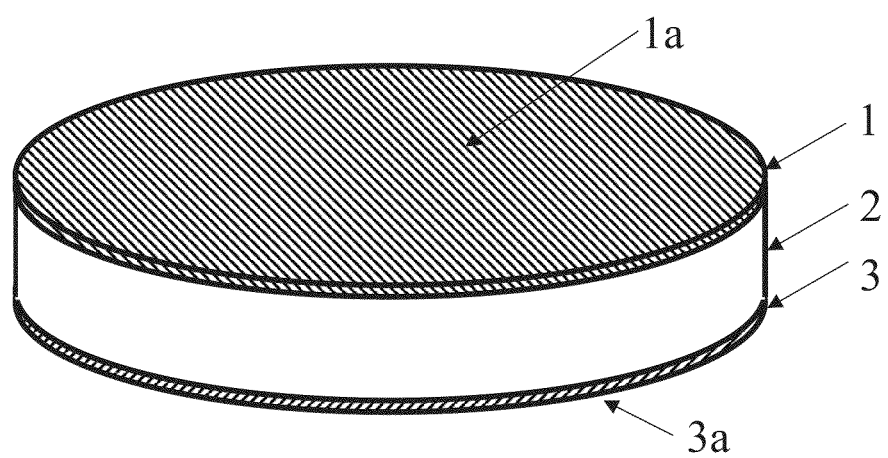
FIG. 1 is a drawing of a group III nitride wafer of present invention.

The current invention presents a group III nitride wafer with one surface visually distinguishable from the other side so that the further polishing process will be conducted without a mistake of processing a wrong side. FIG. 1 presents one example of the current invention. A wafer-shaped layer of highly oriented poly or single crystalline group III nitride (3) is sandwiched between the first layer (1) and the second layer (2) created when the wafer is cut from an ingot using a saw or laser, for instance. The wafer is chemically etched so that the surface of the first layer (1a) is visually distinguishable from the surface of the second layer (2a). One surface is typically distinguished from the other surface with the difference of roughness, reflectivity of light or color.

Group III nitride crystal in the common phase has a wurtzite structure and the crystal is polar along the c-axis. If group III nitride wafers sliced from a group III nitride bulk crystal have c-plane orientation (wafers sliced perpendicular to the c-axis) or semipolar orientation (wafers sliced not parallel nor perpendicular to the c-axis), the wafer has a polarity. i.e. one surface is +polar (or group III face) and the other surface is −polar (or N face). Even nonpolar a- or m-plane with large enough miscut can become polar. Since the chemical, electrical, physical, mechanical, and/or optical properties on the +polar surface are different from those on the −polar surface, it is very important to process a correct surface for a device fabrication. However, after the slicing process, the both surfaces look almost identical because the slicing is conducted through a mechanical means. An appropriate etch such as chemical etching creates one surface visually different from the other surface; thus removing ambiguity of which surface the further process must be conducted on.

Figure 2:
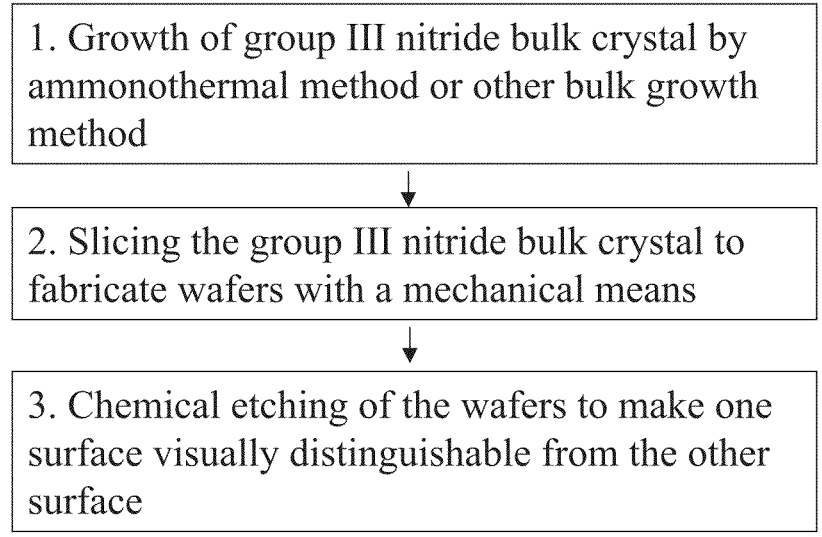
FIG. 2 is a typical process flow to fabricate a group III nitride wafer of present invention.

FIG. 2 presents one example of methods to fabricate the wafer in the current invention. First, a bulk crystal of group III nitride such as GaN is grown by a bulk growth method such as ammonothermal growth, flux growth or high-pressure solution growth. Then, wafers of preferred orientation are sliced from the group III nitride bulk crystal with e.g. a mechanical means such as a multiple wire saw. After the slicing, both surfaces of the wafers become rough due to the mechanical damage of slicing. This surface damage layers of the wafers can be polycrystalline phase and/or amorphous phase due to the damage. Because of this mechanical or heat damage, both surfaces look almost identical even though the wafers have polarity. Then, the wafers are etched a sufficient amount to make one surface visually distinguishable from the other surface. Etching can be conducted with acid, base or other kind of wet or dry etchant. If necessary the temperature of the etching agent can be elevated to accelerate the process. Etching may remove some or all of a damaged layer. Either the group III polar face of one layer or the N-polar face of the other layer may be etched. Also, both the first and second layer may be etched as long as the surface appearance of the two layers becomes different.

EXAMPLE 1

Bulk crystal of GaN was grown on a GaN seed crystal with an ammonothermal method using polycrystalline GaN as a nutrient, supercritical ammonia as a solvent, and sodium (5 mol % to ammonia) as a mineralizer. The temperature was between 500 to 550 C and pressure was between 170 and 240 MPa. The thickness of the crystal was 6.9 mm and the surface area was approximately 100 $mm^2$. A full-width half maximum (FWHM) of the X-ray diffraction from 002 plane was 900 arcsec. From this FWHM number, we estimate the density of line defects and grain boundaries is less than $10^6$ $cm^{-2}$. Although the crystal was not characterized with an optical and electrical measurement, those characteristics are expected to be the typical one for bulk crystal of GaN. For example, photoluminescence or cathode luminescence is expected to show luminescence from band-edge emission at around 370 nm, blue emission at around 400 nm, and/or yellow luminescence at around 600 nm. Conductivity type is expected to be n−type or n+type with carrier concentration from $10^{17}$ to $10^{20}$ cm$^{-3}$. Optical absorption coefficient of such crystal is expected to be 50 cm$^{-1}$ or less. The lattice constant of the crystal was 51.84790 nm for c-lattice and 31.89343 nm for a-lattice. The lattice constant for GaN can change within 10% depending of growth conditions.

Figure 3:
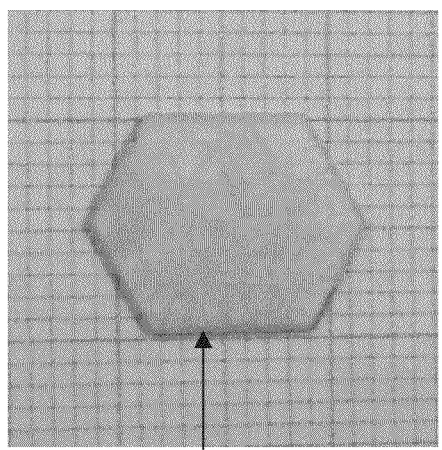
FIG. 3 is a picture of GaN wafer after $H_3PO_4$ etching.
In the figure each number represents the followings:
1. Ga-face (+polar surface)
2. N-face (−polar surface)
Figure 3:
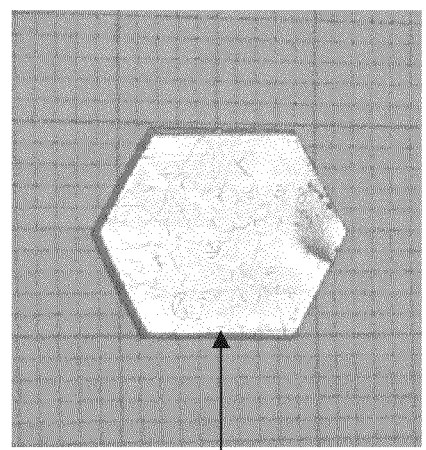

The crystal was sliced into c-plane wafers with a multiple wire saw. The wafer thickness was approximately 500 microns and 8 wafers were fabricated from this particular crystal. We can produce wafers of different thickness by changing the wire pitch. Also, if the crystal is thicker or the wire is thinner, we can obtain more wafers. After the slicing, both surfaces of the wafers looked very similar due to surface damage. The sliced wafers were placed in wafer carriers. Then, the wafers in the carriers were immersed in acetone in an ultrasonic bath to remove diamond slurry and organic substances from the wafers. Acetone cleaning in the ultrasonic bath was repeated until the diamond slurry and organic substances were completely removed. If necessary, the surface of the wafers can be wiped with fibrous wiper. Then, the wafers in the carrier were immersed in isopropanol in an ultrasonic bath to remove acetone followed by a rinse with de-ionized water. After lightly drying the wafers in the carriers with air blower or in a baking oven, the wafers in the carrier were immersed in 85 wt % $H_3PO_4$ at 190° C. for 30 seconds. Then, the wafers were rinsed with de-ionized water. After the etching, N face (−polar surface) became shiny due to the chemical etching whereas the Ga face (+polar surface) did not change its appearance. As shown in FIG. 3 the Ga face does not reflect light well whereas the N face reflects light well so that the surface is visually distinguishable.

Although the details of the surfaces on both wafers were not analyzed, etching of N face is likely to occur because the surface was damaged from the cutting process mechanically and/or with heat (i.e. slicing). Thus, the etching technique of this invention preferably utilizes a mechanical process to cut a wafer from an ingot prior to a preferred chemical etch process. The chemical etching may also be effective to fully or partially remove the damaged layer of group III nitride wafers.

High quality GaN wafers having a surface suitable for device fabrication can be prepared by grinding, lapping, and polishing the Ga face or N face of the wafer. Due to the different appearance of the surface, a mistake to polish a wrong surface will be greatly reduced, which improves production yield.

Advantages and Improvements

The current invention provides a group III nitride wafers having one side visually distinguishable from the other side. Since the transition from the slicing process to the polishing process involves re-mounting of wafers, it is very important to make each surface visually distinguishable from the other. The group III nitride wafer of the current invention will improve the overall production yield of group III nitride wafer such as GaN.

Possible Modifications

Although the preferred embodiment describes GaN substrates, the substrate can be group III nitride alloys of various composition, such as AlN, AlGaN, InN, InGaN, or GaAlInN.

Although the preferred embodiment describes ammonothermal growth as a bulk growth method, other growth methods such as high-pressure solution growth, flux growth, hydride vapor phase epitaxy, physical vapor transport, or sublimation growth can be used.

Although the preferred embodiment describes c-plane wafers, the invention is applicable to other orientations such as semipolar planes including 10-1-1 plane, 20-2-1 plane, 11-21 plane, and 11-22 plane. Also, the invention is applicable to wafers with misorientation from a basal plane (such as c-plane, m-plane, a-plane and semipolar planes) as long as the wafer has +polar (Ga face) and −polar (N face) surface.

Although the preferred embodiment describes slicing with a multiple wire saw, other slicing method such as an inner blade saw, an outer blade saw and a single wire saw can also be used. In addition, the current invention is also applicable to other mechanical process such as grinding and thinning Although the preferred embodiment describes etching with heated phosphoric acid, other acidic etching agent such as hydrochloric acid, sulfuric acid, nitric acid, hydrofluoric acid, and mixture of them may be used. Also basic etching agent such as sodium hydroxide, potassium hydroxide, aqueous solution of them, anhydrous solution of them and eutectic solution of them may be used. In addition, other etching agent such as hydrogen peroxide, iodine-based solutions may be used as long as one surface become visually distinguishable from the other surface.

Consequently, what is disclosed by way of example and not by way of limitation is the following:

1. A group III nitride wafer having composition of $Ga_xAl_yIn_{1-x-y}N$ (0≤x≤1, 0≤x+y≤1), wherein the both surfaces are roughened from a mechanical process and the surfaces are chemically treated to visually distinguish one surface from another.
2. A group III nitride wafer according to paragraph 1, wherein the mechanical process comprises slicing the wafer from a bulk crystal of group III nitride.
3. A group III nitride wafer according to paragraph 1, wherein the mechanical process is grinding of the wafer.
4. A group III nitride wafer in any of claims 1-2, wherein the wafer was sliced from a bulk crystal of group III nitride with a multiple wire saw.
5. A group III nitride wafer according to paragraphs 1 through 4, wherein the chemical treatment is etching.
6. A group III nitride wafer according to paragraph 5, wherein the etching is performed using a wet etchant.
7. A group III nitride wafer according to paragraph 6, wherein the wet etchant comprises phosphoric acid.
8. A group III nitride wafer according to paragraphs 1 through 7, wherein the chemical treatment is etching in phosphoric acid or its mixture at 50° C. or higher.
9. A group III nitride wafer according to paragraphs 1 through 8, wherein the orientation is c-plane with misorientation from minus 10 degree to plus 10 degree.
10. A group III nitride wafer according to paragraphs 1 through 8, wherein the orientation is a semipolar plane with misorientation from minus 10 degree to plus 10 degree.
11. A group III nitride wafer according to paragraphs 1 through 8, wherein the orientation is a nonpolar plane with misorientation from minus 10 degree to minus 0.1 degree or plus 0.1 degree to plus 10 degree.
12. A group III nitride wafer according to paragraphs 1 through 11, wherein the surface area is more than 100 mm$^2$.
13. A group III nitride wafer according to paragraphs 1 through 12, wherein the composition is GaN.
14. A group III nitride wafer comprising a first layer and a second layer of damaged group III nitride on opposite faces of a third layer of highly oriented poly or single crystalline group III nitride, wherein the first and the second layer were formed through a mechanical process and the surface of the second layer is made visually distinguishable from the surface of the first layer by a chemical etching.

15. A group III nitride wafer according to paragraph 14, wherein the wafer is sliced from a bulk crystal of group III nitride.

16. A group III nitride wafer according to paragraph 14 and claim 15, wherein the wafer is sliced from a bulk crystal of group III nitride with a multiple wire saw.

17. A group III nitride wafer according to paragraphs 14 through 16, wherein the chemical etching uses acid or base.

18. A group III nitride wafer according to paragraph 17, wherein the chemical etching uses phosphoric acid or its mixture.

19. A group III nitride wafer according to paragraph 17 and claim 18, wherein the chemical etching uses phosphoric acid or its mixture at 50° C. or higher.

20. A group III nitride wafer according to paragraph 14 through 19, wherein the surface area of the wafer is more than 100 mm$^2$.

21. A group III nitride wafer according to paragraph 14 through 20, wherein the density of line defect and grain boundary of the third layer is less than $10^6$ cm$^{-2}$.

22. A group III nitride wafer according to paragraphs 14 through 21, wherein the group III nitride is GaN.

23. A method of fabricating a group III nitride wafer having a first layer and a second layer, each comprising a damaged or partially damaged layer of group III nitride, and a third layer having highly oriented poly or single crystalline group III nitride, comprising:
    (a) slicing a wafer from a bulk crystal of a group III nitride ingot mechanically;
    (b) chemically etching the wafer under conditions that make the surface of the second layer visually distinguishable from the surface of the first layer.

24. A method according to paragraph 23, wherein the wafer is cut from the ingot using a multiple wire saw.

25. A method according to paragraph 23 or paragraph 24, wherein the chemical etching uses phosphoric acid or its mixture.

26. A method according to any of paragraphs 23 through 25, wherein the chemical etching uses phosphoric acid or its mixture at 50° C. or higher.

27. A method according to any of paragraphs 23 through 26, wherein the density of line defect and grain boundary of the third layer is less than $10^6$ cm$^{-2}$.

28. A method according to any of paragraphs 23 through 27, wherein the group III nitride is GaN.

29. A method of fabricating a group III nitride wafer according to paragraph 28 and including the step of growing a bulk crystal of group III nitride to form the ingot, wherein the growth of bulk crystal of group III nitride uses supercritical ammonia and comprises the following steps:
    (a) charging Ga-containing nutrient in a high-pressure reactor;
    (b) charging at least one seed crystal in the high-pressure reactor;
    (c) charging a chemical additive which increases dissolution of Ga-containing nutrient into the supercritical ammonia;
    (d) charging ammonia in the high-pressure reactor;
    (e) sealing the high-pressure ammonia;
    (f) providing enough heat to ammonia to create supercritical state;
    (g) dissolving the Ga-containing nutrient into the supercritical ammonia;
    (h) crystallizing GaN on the seed crystal.

30. A method of fabricating a group III nitride wafer comprising removing the first layer or the second layer of a wafer of any of paragraphs 14 through 22 and exposing the third layer with a surface quality sufficient to fabricate devices.

31. A method according to paragraph 30, wherein the removing process comprises grinding.

32. A method according to paragraph 30, wherein the removing process comprises lapping.

33. A method according to paragraph 30, wherein the removing process comprises polishing.

34. A method according to paragraph 30, wherein the removing process comprises chemical mechanical polishing.

35. A method according to any of paragraphs 30 through 34, wherein the group III nitride is GaN.

References

The following references are incorporated by reference herein:

[1] R. Dwiliński, R. Doradziński, J. Garczyński, L. Sierzputowski, Y. Kanbara, U.S. Pat. No. 6,656,615.
[2] R. Dwiliński, R. Doradziński, J. Garczyński, L. Sierzputowski, Y. Kanbara, U.S. Pat. No. 7,132,730.
[3] R. Dwiliński, R. Doradziński, J. Garczyński, L. Sierzputowski, Y. Kanbara, U.S. Pat. No. 7,160,388.
[4] K. Fujito, T. Hashimoto, S, Nakamura, International Patent Application No. PCT/US2005/024239, WO07008198.
[5] T. Hashimoto, M. Saito, S, Nakamura, International Patent Application No. PCT/US2007/008743, WO07117689. See also US20070234946, U.S. application Ser. No. 11/784,339 filed Apr. 6, 2007.
[6] D'Eyelyn, U.S. Pat. No. 7,078,731.
[7]. S. Porowski, MRS Internet Journal of Nitride Semiconductor, Res. 4S1, (1999) G1.3.
[8] T. Inoue, Y. Seki, O. Oda, S. Kurai, Y. Yamada, and T. Taguchi, Phys. Stat. Sol. (b), 223 (2001) p. 15.
[9] M. Aoki, H. Yamane, M. Shimada, S. Sarayama, and F. J. DiSalvo, J. Cryst. Growth 242 (2002) p. 70.
[10] T. Iwahashi, F. Kawamura, M. Morishita, Y. Kai, M. Yoshimura, Y. Mori, and T. Sasaki, J. Cryst Growth 253 (2003) p. 1.

What is claimed is:

1. A method of fabricating a group III nitride wafer having a first layer and a second layer, each comprising a damaged or partially damaged layer of group III nitride, and a third layer having highly oriented poly or single crystalline group III nitride, comprising:
    (a) slicing a wafer from a bulk crystal of a group III nitride ingot mechanically to form the first layer and the second layer;
    (b) before chemically-mechanically polishing the wafer, chemically etching the wafer under conditions that make the surface of the second layer visually distinguishable from the surface of the first layer.

2. A method according to claim 1, wherein the wafer is cut from the ingot using a multiple wire saw.

3. A method according to claim 1, wherein the chemical etching uses phosphoric acid or its mixture.

4. A method according to claim 1, wherein the chemical etching uses phosphoric acid or its mixture at 50° C. or higher.

5. A method according to claim 1, wherein the density of line defect and grain boundary of the third layer is less than $10^6$ cm$^{-2}$.

6. A method according to claim 1, wherein the group III nitride comprises GaN.

7. A method of fabricating a group III nitride wafer comprising removing the first layer or the second layer of a wafer of claim 1 and exposing the third layer with a surface quality sufficient to fabricate devices.

8. A method according to claim 7, wherein the removing process comprises grinding.

9. A method according to claim 7, wherein the removing process comprises lapping.

10. A method according to claim 7, wherein the removing process comprises polishing.

11. A method according to claim 7, wherein the removing process comprises chemical mechanical polishing.

12. A method according to claim 7, wherein the group III nitride comprises GaN.

13. A method according to claim 1, wherein said bulk crystal was formed using supercritical ammonia.

14. A method according to claim 12, wherein said bulk crystal was formed using supercritical ammonia.

15. A method according to claim 1, wherein a plane at the surface of the first layer is nonpolar and wherein the surface is miscut to the nonpolar plane a sufficient amount that the surface is polar.

16. A method according to claim 1, wherein the step of etching the wafer is performed before a step of lapping the wafer.

17. A method according to claim 1, wherein the method further comprises using a visual distinction between the surface of the first layer and the surface of the second layer to determine which of said layers to process in a subsequent processing step.

18. A method according to claim 17, wherein the subsequent processing step is selected from the group consisting of (a) lapping and (b) polishing.

19. A method according to claim 18, wherein the method further comprises forming a device on the wafer.

20. A method of fabricating a GaN wafer having a first layer and a second layer, each comprising a damaged or partially damaged layer of GaN, and a third layer having highly oriented poly or single crystalline GaN, comprising:

(a) charging Ga-containing nutrient in a reactor;
(b) charging at least one seed crystal in the reactor;
(c) charging a chemical additive which increases dissolution of Ga-containing nutrient into supercritical ammonia;
(d) charging ammonia in the reactor;
(e) sealing the reactor;
(f) providing enough heat to ammonia to create supercritical state;
(g) dissolving the Ga-containing nutrient into the supercritical ammonia;
(h) crystallizing GaN on the seed crystal to form a bulk crystal of a GaN ingot;
(i) slicing a wafer from the bulk crystal of the GaN ingot mechanically; and
(j) chemically etching the wafer under conditions that make the surface of the second layer visually distinguishable from the surface of the first layer.

\* \* \* \* \*